United States Patent
Singhal et al.

[11] Patent Number: 6,057,809
[45] Date of Patent: May 2, 2000

[54] MODULATION OF LINE-SELECT TIMES OF INDIVIDUAL ROWS OF A FLAT-PANEL DISPLAY FOR GRAY-SCALING

[75] Inventors: Dave M. Singhal, San Jose; Chester F. Bassetti, Danville, both of Calif.

[73] Assignee: NeoMagic Corp., Santa Clara, Calif.

[21] Appl. No.: 09/082,003

[22] Filed: May 20, 1998

Related U.S. Application Data

[63] Continuation-in-part of application No. 08/701,814, Aug. 21, 1996, Pat. No. 5,757,338.

[51] Int. Cl.[7] ........................................... G09G 5/00
[52] U.S. Cl. ................................ 345/3; 345/87; 345/89
[58] Field of Search ............................. 345/3, 87, 89, 345/213

[56] References Cited

U.S. PATENT DOCUMENTS

| | | | |
|---|---|---|---|
| 4,021,607 | 5/1977 | Amano | 358/230 |
| 5,075,683 | 12/1991 | Ghis | 340/793 |
| 5,091,722 | 2/1992 | Kitajima et al. | 340/784 |
| 5,103,144 | 4/1992 | Dunham | 315/366 |
| 5,337,408 | 8/1994 | Fung et al. | 395/162 |
| 5,347,294 | 9/1994 | Usui et al. | 345/89 |
| 5,420,604 | 5/1995 | Scheffer et al. | 345/100 |
| 5,455,602 | 10/1995 | Tew | 347/239 |
| 5,459,495 | 10/1995 | Scheffer et al. | 345/147 |
| 5,479,184 | 12/1995 | Tokumitsu | 345/3 |
| 5,596,344 | 1/1997 | Kuwata et al. | 345/103 |
| 5,608,418 | 3/1997 | McNally | 345/3 |
| 5,610,621 | 3/1997 | Itoh et al. | 345/3 |
| 5,633,923 | 5/1997 | Kovarik | 379/265 |
| 5,642,133 | 6/1997 | Scheffer et al. | 345/147 |
| 5,659,331 | 8/1997 | Oh et al. | 345/95 |
| 5,694,141 | 12/1997 | Chee | 345/1 |
| 5,696,524 | 12/1997 | Hoshino et al. | 345/89 |
| 5,821,910 | 10/1998 | Shay | 345/99 |
| 5,841,418 | 11/1998 | Bril et al. | 345/3 |

FOREIGN PATENT DOCUMENTS 0 519 744 A2  12/1992  European Pat. Off.

*Primary Examiner*—William A. Cuchlinski, Jr.
*Assistant Examiner*—Marthe Y. Marc-coleman
*Attorney, Agent, or Firm*—Stuart T. Auvinen

[57] ABSTRACT

The amount of time that a row of pixels in a flat-panel display is illuminated is modulated from frame-to-frame and from row-to-row. Pixels in rows that are on for a longer period of time appear brighter than pixels in rows that are on for shorter periods of time. Such line modulation is combined with frame-rate-cycling (FRC) to dramatically increase the number of gray scales that can be generated for any given number of frames in a FRC cycle, and with phase-offsetting to keep the frame period constant and to reduce flicker. An N-frame FRC cycle that previously generated N+1 gray scales now produces a full $2^N$ gray scales. The total pixel-on time over the N frame cycle depends not just on how many frames the pixel is on, but on which frames the pixel is on. Since each row in each frame in the FRC cycle is on for a different amount of time, aliasing of the frames is greatly lessened or no longer occurs. A line modulation buffer and speeding up the pixel clock to the panel allow for greater modulation.

21 Claims, 6 Drawing Sheets

4-FRAME FRC (FRM 1, FRM 2, FRM 3, FRM 4)

$$(1111) = 25uS \times 4 = 100uS/4 \text{ FRAMES}$$
$$(1011),(1101),(1110),(0111) = 25uS \times 3 = 75uS/4 \text{ FRAMES}$$
$$(1100),(1010),\ldots(0011) = 25uS \times 2 = 50uS/4 \text{ FRAMES}$$
$$(1000),(0100),(0010),(0001) = 25uS \times 1 = 25uS/4 \text{ FRAMES}$$
$$(0000) = 25uS \times 0 = 0uS/4 \text{ FRAMES}$$

5 GRAY-SHADES

T1 = 1024 x T(PIX)

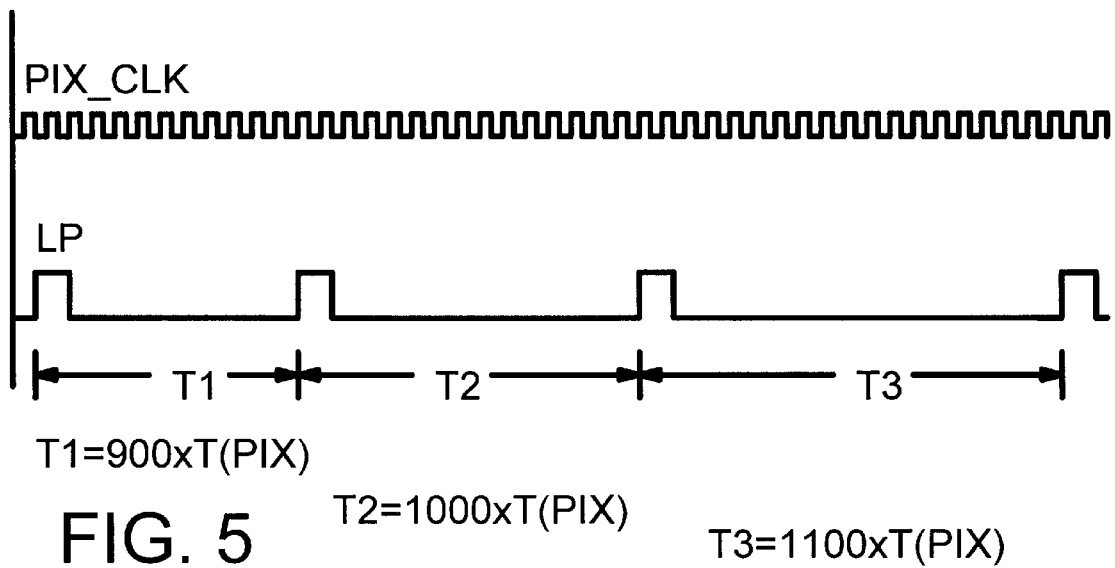

T1=900xT(PIX)

FIG. 5   T2=1000xT(PIX)

T3=1100xT(PIX)

4-FRAME FRC

ROW 1

(FRM 1, FRM 2, FRM 3, FRM 4)

```
(1111) = 17+20+27+36 uS =100uS/4 FRAMES
(0111) =  0+20+27+36 uS = 83uS/4 FRAMES
(1011) = 17+ 0+27+36 uS = 80uS/4 FRAMES
(1101) = 17+20+ 0+36 uS = 73uS/4 FRAMES
(1110) = 17+20+27+ 0 uS = 64uS/4 FRAMES
(0011) =  0+ 0+27+36 uS = 63uS/4 FRAMES
(0101) =  0+20+ 0+36 uS = 56uS/4 FRAMES
(0110) =  0+20+27+ 0 uS = 47uS/4 FRAMES
(1001) = 17+ 0+ 0+36 uS = 53uS/4 FRAMES
(1010) = 17+ 0+27+ 0 uS = 44uS/4 FRAMES
(1100) = 17+20+ 0+ 0 uS = 37uS/4 FRAMES
(1000) = 17+ 0+ 0+ 0 uS = 17uS/4 FRAMES
(0100) =  0+20+ 0+ 0 uS = 20uS/4 FRAMES
(0010) =  0+ 0+27+ 0 uS = 27uS/4 FRAMES
(0001) =  0+ 0+ 0+36 uS = 36uS/4 FRAMES
(0000) =  0 + 0 + 0 + 0 uS =  0uS/4 FRAMES
```

FIG. 6   16 GRAY-SHADES

|  | FRM 1 | FRM 2 | FRM 3 | FRM 4 | FRM 5 | FRM 6 |
|---|---|---|---|---|---|---|
| ROW 1 | 17uS | 20uS | 27uS | 36uS | 17uS | 20uS |
| ROW 2 | 20uS | 27uS | 36uS | 17uS | 20uS | 27uS |
| ROW 3 | 27uS | 36uS | 17uS | 20uS | 27uS | 36uS |
| ROW 4 | 36uS | 17uS | 20uS | 27uS | 36uS | 17uS |
| ROW 5 | 17uS | 20uS | 27uS | 36uS | 17uS | 20uS |
| ROW 6 | 20uS | 27uS | 36uS | 17uS | 20uS | 27uS |
| ROW 7 | 27uS | 36uS | 17uS | 20uS | 27uS | 36uS |
| ROW 8 | 36uS | 17uS | 20uS | 27uS | 36uS | 17uS |
| ⋮ | ⋮ | ⋮ | ⋮ | ⋮ | ⋮ | ⋮ |
| ROW 597 | 17uS | 20uS | 27uS | 36uS | 17uS | 20uS |
| ROW 598 | 20uS | 27uS | 36uS | 17uS | 20uS | 27uS |
| ROW 599 | 27uS | 36uS | 17uS | 20uS | 27uS | 36uS |
| ROW 600 | 36uS | 17uS | 20uS | 27uS | 36uS | 17uS |

FIG. 7

MODULATION OF LINE-SELECT TIMES OF INDIVIDUAL ROWS OF A FLAT-PANEL DISPLAY FOR GRAY-SCALING

RELATED APPLICATION

This is a continuation-in-part (CIP) of the application "EMI Reduction for a Flat-Panel Display Controller Using Horizontal-Line-Based Spread Spectrum", U.S. Ser. No. 08/701,814, filed Aug. 21, 1996, now U.S. Pat. No. 5,757,338.

FIELD OF THE INVENTION

This invention relates to graphics systems, and more particularly to gray-scale shading for flat panel displays.

BACKGROUND OF THE INVENTION

Flat-panel displays are widely used for portable computers such as laptop and notebook personal computers (PCs). Super-twisted nematic (STN) liquid-crystal displays (LCDs) are relatively inexpensive. Most of these displays are inherently digital devices that display pixels as either on or off. In contrast, cathode-ray tube (CRT) monitors are inherently analog devices, receiving analog voltages that generate pixels as color shades within a continuous spectrum of colors. Many portable PCs contain a built-in flat-panel display and a port or connector for an external CRT display. Thus both the CRT and the flat-panel are driven by the portable PC's graphics system.

The analog CRT pixels (as 8-bit digitized values) are converted to binary digital pixels by a gray-scale converter. The color intensities are converted to on or off pixels. While the term "gray" scaling is still used, this shading technique is applied to color displays as well as black-and-white monochrome displays. The shading technique is applied to the three primary color components (red, green, blue) to achieve color shades.

LCD Pixels Stored in 3-Bit Format—FIG. 1

FIG. 1 shows that CRT pixels are stored in a 24-bit format while LCD pixels are stored in a 3-bit format. Eight bits are used to indicate the intensity of each color component in the 24-bit-per-pixel format. For example, when the R component is 000, G is 107, and B is 255, then red is off, blue in fully on, and green is not quite halfway on. This is a blue-green color shade.

Upon LCD conversion, the 24-bit format is reduced to only 3 bits. These 3 bits indicate when each of the R,G,B color components are on or off. The blue-green color (000, 107,255) is converted to (0,1,1). This has red off bit both blue and green fully on. The color conversion is not exact since the LCD converted pixel has more green (50%) than the 24-bit pixel (29.6%).

Frame-Rate-Cycling—FIG. 2

A common gray-scaling technique is known as frame-rate cycling (FRC). A pixel's shading is approximated by blinking the pixel on and off over a cycle of several frames. For example, a 50% gray can be approximated by turning the pixel on for one frame, but off for the next frame. A 25% gray scale is approximated by turning the pixel on for one frame, then off for three frames.

Frame-rate cycling (FRC) improves accuracy of conversion, since multiple frames (typically two frames) are generated for each input CRT frame. If four frames could be generated for each input CRT frame, as shown in FIG. 2, then gray-scale conversion is more accurate. FIG. 2 shows an example where each input CRT frame is converted to four LCD frames using data acceleration. CRT frame I is converted by gray-scale conversion to four LCD frames 1, 2, 3, 4. While CRT frames use a 24-bit-per-pixel format, LCD frames use 3-bits-per-pixel. CRT frame II, the next frame from the frame buffer and pixel pipeline, is likewise converted to four LCD frames 5, 6, 7, 8. The LCD frames are sent to the flat panel at four times the rate of the CRT frames. The four frames can be used to better approximate the colors of the CRT pixels.

Frame-rate cycling is used to better approximate color shades. For example, when the green component G is 107 (41% of 255), it can be approximated as shown in FIG. 7. For CRT frame I, G=128 is converted to LCD frames that have G on 50% of the time. LCD frames 1 and 3 have G on, but LCD frames 2 and 4 have G off.

CRT frame 2 has G=64, one-quarter of the full 255 value. LCD frame 5 has G on, but LCD frames 6, 7, 8 have G off. Thus G is on 25% of the time.

When G=107, it could be approximated by either G=128 or G=64. These are better approximations than FIG. 6, which approximates G=107 as fully on (G=255). Using more frames results in better shading approximations, since intermediate values can be generated. For example, if 8 frames were generated per CRT frame, then G=96 could be generated, a still better approximation for G=107 than G=128 or G=64, the closest value available for four frames.

Unfortunately, generating multiple frames to approximate a shade is limited by the maximum refresh rate the flat panel can tolerate and by the slower frame integration time introduced. For example, keeping both the integration time down to 100 mS and the maximum frame rate below 200 Hz limits the number of frames displayable for approximating each shade to 20 Frames. Such limits require either faster, more expensive panels, or are simply not supportable.

5 Shades from 4-Frame FRC—FIG. 3

FIG. 3 shows that 5 gray shades can be generated from blinking pixels on and off over a 4-frame FRC cycling. When two CRT frames are converted into four LCD frames, any pixel position on the flat-panel display can be turned on for 0, 1, 2, 3, or 4 of the frames. When the pixel is turned on for all four frames (1111), the maximum intensity is generated. When the pixel is turned off for all four frames (0000), the minimum intensity is generated.

The shade of a pixel is related to the amount of time the pixel is on. If each pixel is on for 25 micro-seconds ($\mu$S) for each frame, then the pixel is on for a total of 100 $\mu$S over the four frames for maximum intensity (1111), or 0 $\mu$S for minimum intensity. When the pixel is on for three of the four frames (1110), the pixel is on for 75 $\mu$S, about 75% of maximum intensity. Likewise for pixels on half of the frames (1100), 50 $\mu$S (50% intensity) or on for one of the four frames (1000), 25 $\mu$S (25% intensity).

A total of five shades can be generated for any pixel using 4-frame FRC. Any pixel can be on for 100%, 75%, 50%, 25%, or 0% of the four frames.

The gray shade produced does not depend on which of the four frames a pixel is on or off. The same 25% gray scale is produced whether the pixel is on for the first frame and off for the last three (1000), or on for just the second, third, or fourth frames (0100), (0010), (0001). Since each frame has identical timing, the pixel is on for 25 $\mu$S per frame, regardless of which frame the pixel is turned on.

Although there are 16 combinations possible of the four frames, only 5 shades are produced since many combinations produce the same on time for the pixel. The exact pattern of turning the pixel on and off over the four frames is often chosen for other reasons, such as flicker reduction.

Identical Timing for Each Frame and Row—FIG. 4

FIG. 4 highlights that each horizontal line or row of each frame is on for the same period of time. A pixel clock PIX_CLK is used to transfer pixels to a shift register in the flat-panel display. Sometimes multiple pixels are latched in for each clock period, so the pixel clock is sometimes called a character or shift clock. After an entire line of pixels has been latched in, a line pulse (LP) is generated to load the entire row into the display matrix. These loaded pixels either turn on or turn off display elements in the matrix that remain on or off until the next line pulse (LP).

The period of the line pulse, T1, is a multiple of the pixel clock period. The line period is somewhat longer than required for the number of displayed pixels in a line. The extra time is called the retrace or blanking period. For example, a SVGA line of 800 displayed pixels might have a total period of 1024 pixel periods. Each line within a frame has the same period T1, and each frame has the same total period.

CRT monitors are analog devices that are synchronized to inputs such as vertical and horizontal sync pulses. The CRT's data is timed to these sync pulses. These sync pulses must be very stable signals having a constant period; otherwise the pixel data appears at the wrong point on the display screen. Should the period vary, pixel positioning can be lost, resulting in distortions or loss of picture.

Flat-Panel signals such as the line pulse and a frame clock are often derived from CRT sync signals. Indeed, the line pulse is often called the horizontal clock H_CLK. Since the flat-panel signals are derived from the CRT signals, they are also stable, constant-period signals.

An axiom of graphics design is this stability of signals, having exactly equal periods over many lines and frames. While flat-panel displays, being digital devices, do not phase-lock to inputs, most graphics designers, trained in traditional CRT design, stick to constant-period signals.

Recently some graphics systems are using varying-period signals for reducing electromagnetic emissions and interference (EMI). See for example "EMI Reduction for a Flat-Panel Display Controller Using Horizontal-Line-Based Spread Spectrum", U.S. Ser. No. 08/701,814, now U.S. Pat. No. 5,757,338, where the period to the flat panel is modulated using spread-spectrum techniques to reduce EMI.

What is desired is a graphics controller with improved gray-scaling. It is desired to increase the number of gray shades produced for a fixed number of frames. It is desired to produce more than 5 gray shades over a 4-frame FRC cycle. It is desired to take advantage of the inherently digital nature of the flat-panel display to increase available gray scales using FRC.

SUMMARY OF THE INVENTION

A flat-panel graphics controller has a modulated line clock to a flat-panel display. The flat-panel graphics controller has a pixel pipeline that generates a stream of pixels for display. A gray-scale converter is coupled to receive the stream of pixels from the pixel pipeline. It converts the stream of pixels from a multi-bit-per-color cathode-ray tube (CRT) format to a single-bit-per-color flat-panel format. The gray-scale converter generates multiple frames of a pixel in the flat-panel format for each pixel received in the CRT format. The gray-scale converter outputs converted pixels in the flat-panel format.

A buffer is coupled to the gray-scale converter. It stores the converted pixels for display by the flat-panel display. A data formatter is coupled to the buffer. It arranges the converted pixels from the buffer for transfer to the flat-panel display.

A modulated line-pulse generator is coupled to the flat-panel display by a line-pulse signal. It generates a line pulse at an end of a horizontal line of pixels sent to the flat-panel display by the data formatter. The line-pulse signal has a modulated period that varies for different horizontal lines. A first horizontal line and a second horizontal line of pixels sent to the flat-panel display by the data formatter have different horizontal periods of time between line pulses.

The line pulse causes the flat-panel display to end illumination of a current horizontal line of pixels and shift in a next horizontal line of pixels into a display matrix for visibly illuminating pixels on the display. Thus the horizontal period of time between line pulses is not constant but is modulated.

In further aspects of the invention a row-intensity control for the gray-scale converter indicates when the stream of pixels are for display in a first horizontal line that has a high intensity from a longer horizontal period, or in a second horizontal line with a lower intensity from a shorter horizontal period. The line-pulse signal is also modulated across the multiple frames generated by the gray-scale converter. Thus a first horizontal line in a first frame has a different horizontal period that the first horizontal line in a second frame.

In still further aspects the first horizontal line has a different horizontal period when displayed in each of the multiple frames generated across multiple frames that comprise a frame sequence of row times that are on or off and that integrate to the shade value. Any physical horizontal line of the display has a different horizontal period when displayed in each of the multiple frames generated. Thus the horizontal periods are modulated across multiple frames.

In other aspects the gray-scale converter performs gray-scaling by frame-rate cycling (FRC). It turns a pixel on and off over a cycle of multiple frames where a gray-scale shade generated is proportional to a total amount of time that a pixel is illuminated during the cycle of multiple frames.

In further aspects a pixel is illuminated for a longer period of time for one frame than for another frame in the cycle of multiple frames. The gray-scale converter darkens the gray-scale shade generated by illuminating the pixel for the frame with the shorter period of pixel illumination relative to the frame with the longer period. Thus the gray-scale converter changes the gray-scale shade by selecting which frames in which the pixel is illuminated, and not just by a number of frames has the pixel illuminated.

BRIEF DESCRIPTION OF THE DRAWINGS

FIG. 5 illustrates that the horizontal line period is varied for different rows.

FIG. 6 shows the 16 gray shades generated by a 4-frame FRC cycle using modulated row periods.

FIG. 7 illustrates how the on-times are modulated for different rows within the same frame, and for the same row for successive frames.

DETAILED DESCRIPTION

The present invention relates to an improvement in graphics systems. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that many flat-panel displays do not need to be driven with constant-frequency signals having exactly equal periods. Unlike a CRT, a typical flat-panel does not phase-lock or synchronize itself to inputs. Most (but not all) flat-panels can tolerate variable periods such as variable line periods.

Figure 1:
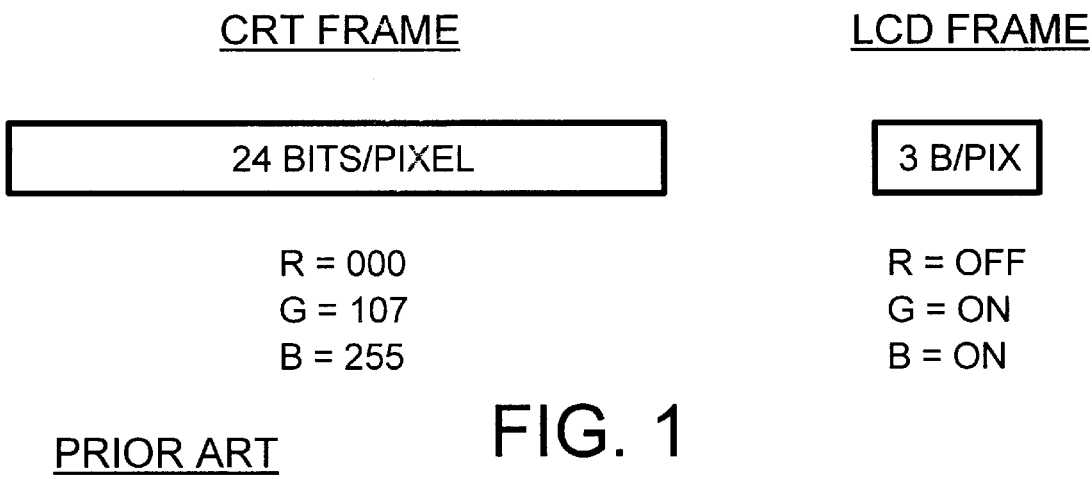
FIG. 1 shows that CRT pixels are stored in a 24-bit format while LCD pixels are stored in a 3-bit format.
Figure 2:
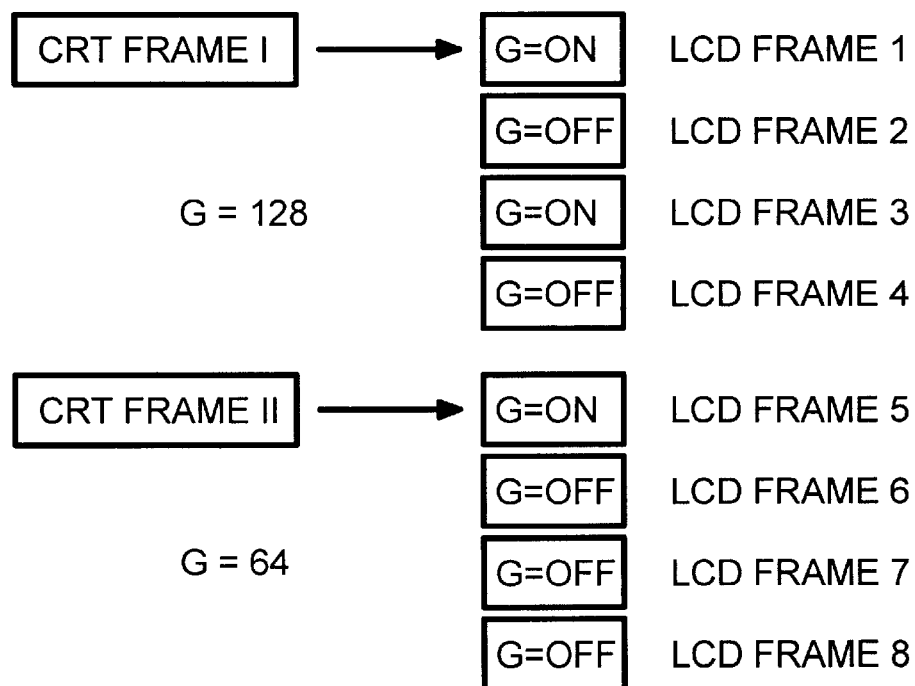
FIG. 2 shows each input CRT frame converted to four LCD frames using data acceleration.
Figures 3, 4:
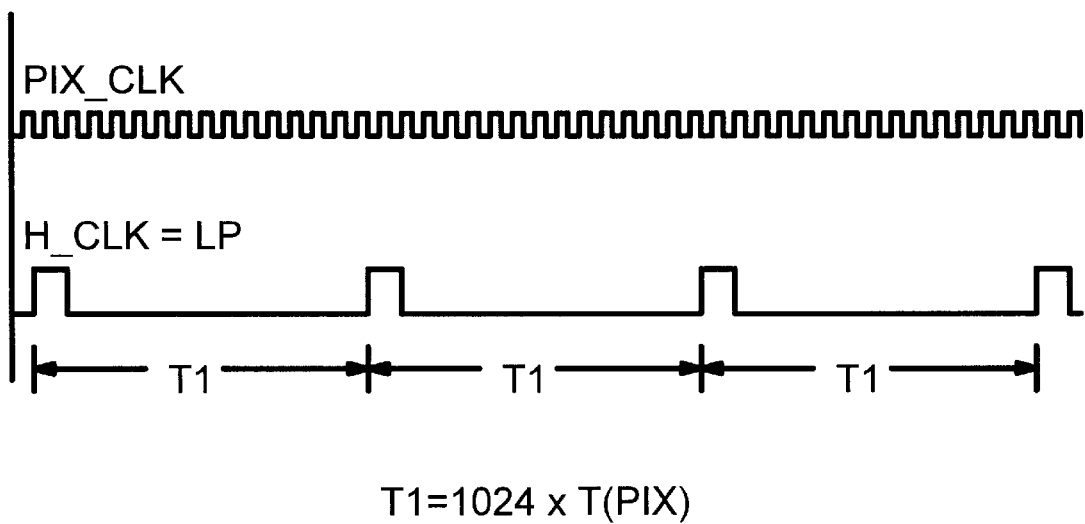
FIG. 3 shows that 5 gray shades can be generated from blinking pixels on and off over a 4-frame FRC cycling.
FIG. 4 highlights that each horizontal line or row of each frame is on for the same period of time.

The inventors have devised a way to exploit the digital nature of the flat-panel display by varying the line-pulse period. Some rows are left on for a longer period of time than other rows. When variable-row times are combined with frame-rate-cycling, pixels are left on for differing periods of times in different frames. Even when the pixel is on for only one of the four frames in a FRC cycle, the intensity of the pixel depends on which one of the four frames the pixel is turned on. Different shades are produced by turning on the pixel in the first of four frames (1000) rather than in the last of four frames (0001), which had identical shades in the prior art of FIG. 3.

Since the intensity or shade of the pixel depends on both the number of frames it is turned on, and the amount of time the pixel is on for the frame, aliasing of the available shades is lessened or no longer occurs. Each of the 6 possible patterns generated by turning a pixel on for two of the four frames produces a slightly different shade. Likewise, each of the 4 patterns of one pixel-on frame has a different shade, as do each of the four patterns with a pixel on for three frames. Thus a full 16 shades can be generated from four frames (24) rather than only 5, as seen by comparison of the prior art shown in FIG. 3 with FIG. 6.

Variable Horizontal-Line Select Time—FIG. 5

FIG. 5 illustrates that the horizontal line period is varied for different rows. The line pulse (LP) to the flat-panel display has a modulated period rather than being constant in frequency. For the first horizontal line shown, the line-pulse period T1 is 900 pixel periods T(PIX). Since 800 pixels are displayed in a line for SVGA resolution, this leaves a horizontal blanking period of 100 pixel-periods. The second line has a line-pulse period T2 of 1000 pixel-periods, with a horizontal blanking period of 200 pixel-periods. The third line has a period T3 of 1100 pixel-periods, with a horizontal blanking period of 300 pixel-periods (1100–800). Since there is no physical retrace such as for an electron-gun beam in a CRT, the horizontal blanking period to the flat-panel can be varied. It typically is adjusted so that the average LP period is identical to the Hsync Period (usually the CRT HSYNC or the pixel data paths line period). It typically also is adjusted so that each modulated line period is an integer multiple of the shift clock or character clock for the panel.

Pixels are illuminated by the panel matrix for an entire period until the next line pulse. The LP signal is usually an asymmetric signal with a very low duty cycle since the active pulse is very short compared with the length of the period of the LP signal. Pixels of line N are dimmed shortly before the next line (N+1 or 1) is shifted from the buffer to the matrix, commanded by the LP signal. The average line period for the three lines shown is 1000*T(PIX). The first line period is 90% of the average, while the third line is 110% of the average.

Pixels in the first line are illuminated for a 10% shorter period of time, while pixels in the third line are illuminated for a 10% longer period of time than average. First-line pixels appear approximately 10% dimmer (grayer) than average, while third-line pixels appear approximately 10% brighter (whiter).

The modulation pattern of FIG. 5 is repeated for other lines in the panel, and for other frames of lines. The sequence of line periods is advanced when a new frame is started so that the assignment of horizontal-line periods to physical rows is changed from frame to frame. For example, period T1 might be assigned to row 1 for the first frame, but in the second frame period T2 is assigned to row 1, while in the third frame period T3 is assigned to row 1. An approximately 10% grayer shade is produced by turning a pixel in row 1 on for the first frame (T1) and off for the second and third frames, than for turning the pixel on for the second frame (T2) and off for frames one and three.

16 Gray Shades for 4-Frame FRC—FIG. 6

FIG. 6 shows the 16 gray shades generated by a 4-frame FRC cycle using modulated row periods. For any particular row of pixels in the flat-panel display, such as row 1, the row of pixels are illuminated for the period of the line-pulse LP signal, less a transition time, which is most of the line-pulse period. For the first of the four-frame cycle, row 1 is illuminated for 17 $\mu$S. Row 1 is illuminated for 20 $\mu$S, 27 $\mu$S, and 36 $\mu$S for the second, third, and fourth frames of the four-frame FRC cycle.

When a pixel is turned on for the fourth frame rather than for the first frame, it is illuminated for 36 $\mu$S rather than 17 $\mu$S, appearing brighter. Yet the pixel is still on for only one of the four frames.

The shade displayed is related to the total time a pixel is illuminated during the four-frame cycle. Although the brightness relationship is not linear, it can be approximated as linear and later corrected during the design of a controller chip.

The maximum brightness (whiteness of the shade) is attainted by turning a pixel on for all four frames, designated (1111). The pixel is on for a total of 17+20+27+36=100 $\mu$S, an average of 25 $\mu$S per frame.

The dimmest (grayest) shade is generated by leaving the pixel off for all four frames (0000), which is on for 0 $\mu$S. The four combinations where the pixel is on for just one of the four frames (1000), (0100), (0010), and (0001) have total on times of 17, 20, 27, and 36 $\mu$S. These appear as gray shades of about 17%, 20%, 27%, and 36% of the full brightness color.

The four combinations where the pixel is on for three of the four frames (0111), (1011), (1101), and (1110) have total on times of 83, 80, 73, and 64 $\mu$S. These total times are calculated by summing the on times for the frames that the pixel is turned on. For example, the total on time for (1101) where the pixel is on for frames 1, 2, and 4 is 17+20+0+36=73 $\mu$S. This shade appears as a gray shade that is 73% of the maximum brightness (1111), 100 $\mu$S.

The six combinations where the pixel is on for two of the four frames have six different total on times—37, 44, 47, 53, 56, and 63 μS. These appear as gray shades of 37%, 44%, 47%, 53%, 56%, and 63% of the full-intensity color. In the prior art, these six shades collapse to just one shade (50% or 50 μS).

Row On-Times Modulated Within a Frame and for Successive Frames—FIG. 7

FIG. 7 illustrates how the on-times are modulated for different rows within the same frame, and for the same row for successive frames. For super-VGA mode (SVGA), there are displayed 600 lines of 800 pixels each line. Each line drives one row in the flat-panel matrix. Once all 600 lines have been driven to the display, a frame-clock is pulsed and the first line of the next frame is driven to the first row of the matrix.

Rather than drive each row for the same period of time, the inventors drive rows for differing amounts of time. FIG. 7 shows that for the first frame, row 1 is driven for 17 μS, then row 2 is driven for 20 μS, then row 3 is driven for 27 μS, followed by row 4 being driven for 36 μS. The modulation pattern then repeats for the next four rows: row 5 is driven for 17 μS, row 6 for 20 μS, row 7 for 27 μS, and row 8 for 36 μS. The modulation pattern is repeated for all other groups of four rows, until the last four rows (row 597, 598, 599, and 600) are driven with the same modulation pattern (17, 20, 27, 36 μS).

After the last row 600 has been drive, a vertical blanking period occurs. The vertical blanking period is usually several line-periods in length. A frame clock is pulsed to reset the flat-panel display from row 600 to the first row. The next frame then begins with row 1. The modulation sequencing is advanced by one row so that row 1 is driven for 20 μS in frame 2 rather than 17 μS as for frame 1. The pattern 20, 27, 36, 17 μS is applied to each group of four rows in frame 2—rows 1–4, 5–6, etc, until rows 597–600. In the third frame, the modulation pattern is again advanced by one row, so that now row 1 is driven for 27 μS, the same as row 3 in frame 1. The modulation pattern 27, 36, 17, 20 μS is repeated for each group of four rows in the third frame. The modulation pattern again skips ahead by one row at the start of frame 4, so that row 1 is driven for 36 μS. The modulation pattern for frame 4 is 36, 17, 20, 27 μS, repeated every four rows.

Frames 1–4 are a four-frame FRC cycle. A pixel in row 1 can be made a brighter shade by turning the pixel on for frames 3 or 4 rather than for frames 1 or 2. However, a pixel in row 3 is made brighter by turning it on for frames 1 or 2, since frames 3 and 4 have shorter on-times for row 3 than do frames 1 and 2. Thus the frame pattern for row 3 is opposite to than for row 1. Each row in a group of four rows has a different modulation pattern over the four-frame FRC cycle.

The total time for each four-row group in any frame is constant, so the total frame time is kept constant. The vertical total time (equal to the display line time and the retrace line time) is an integer multiple of the four-row time of the sequence of modulated row-times. Keeping the frame period constant simplifies design of the graphics system. Any row has the same total on time for every cycle of four frames due to the repeating modulation pattern.

HARDWARE

Figure 8:
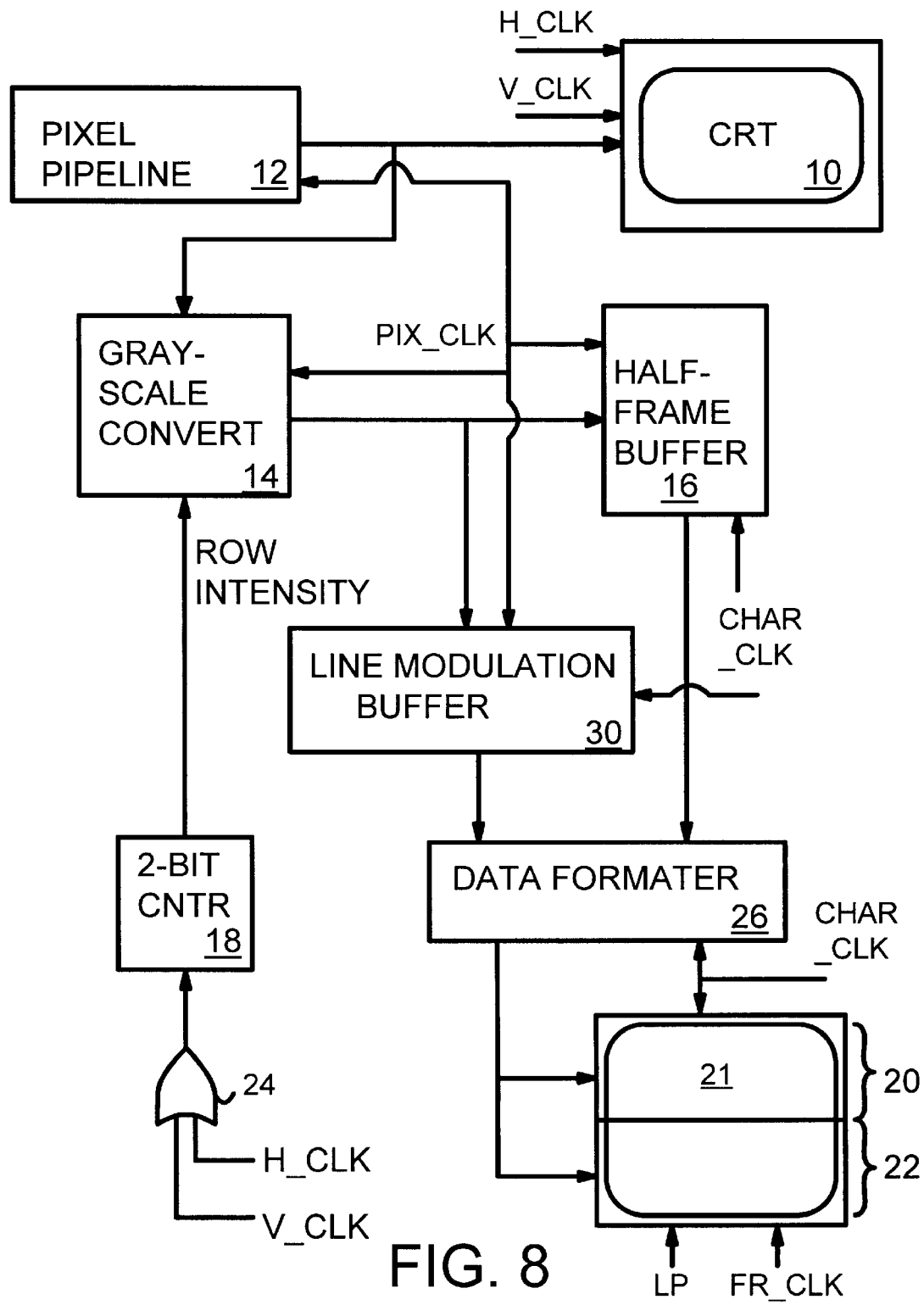
FIG. 8 shows a graphics subsystem that generates various gray shades by modulating the line-select time of horizontal rows in the flat-panel display.
Figure 9:
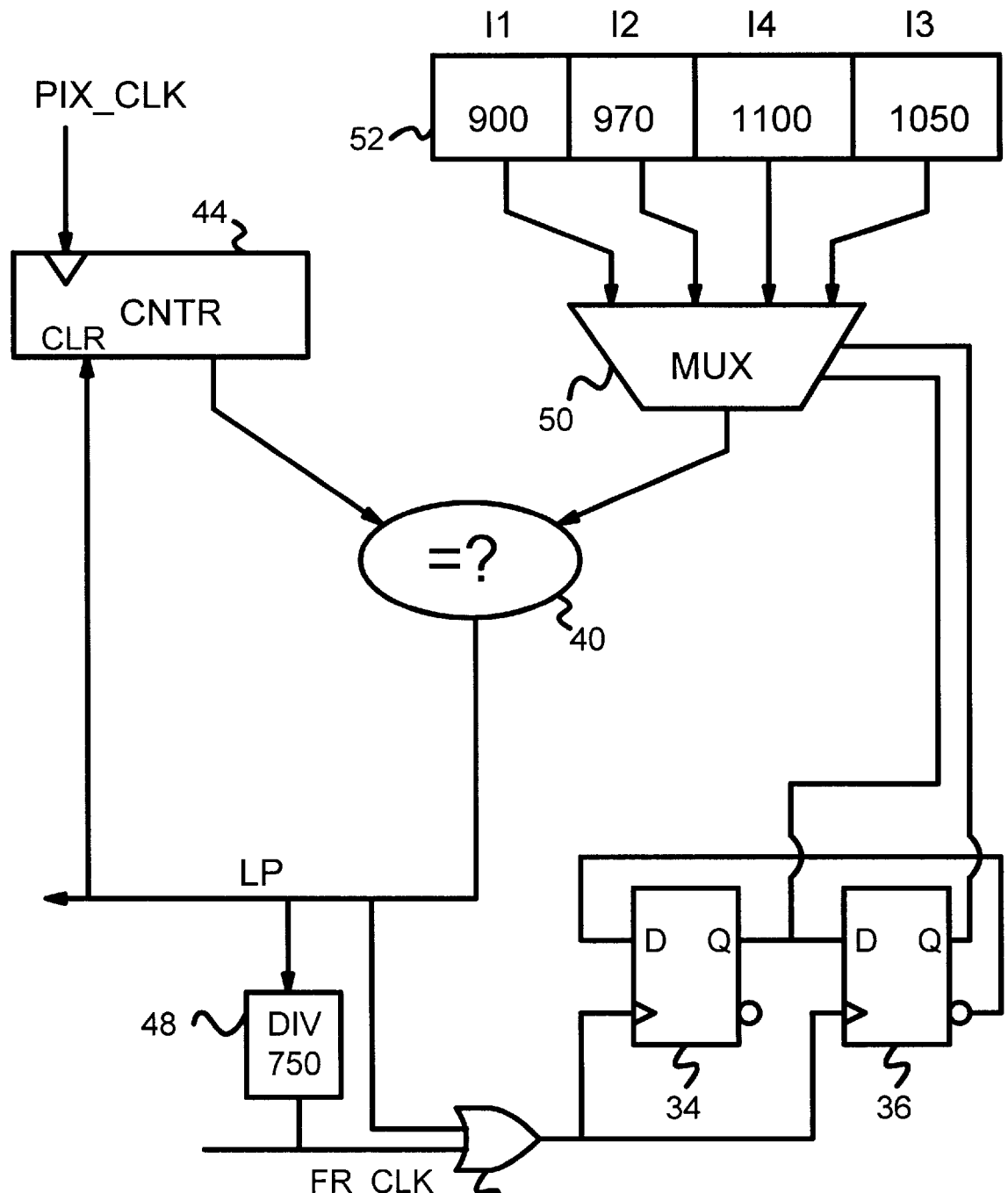
FIG. 9 is a diagram of a generator for the modulated line pulse to the flat-panel display.

The invention can be implemented in a variety of ways. An illustrative embodiment is shown in FIGS. 8, 9. FIG. 8 shows a graphics subsystem that generates various gray shades by modulating the line-select time of horizontal rows in the flat-panel display.

The illustrated graphics subsystem uses a half-frame buffer, although some flat-panel systems do not use dual-scan displays. Pixel pipeline 12 receives a stream of multi-bit pixels from a frame-buffer memory (not shown) and converts these pixels for display by cathode-ray tube (CRT) 10. A digital-to-analog converter DAC (not shown) changes the multi-bit pixels to analog voltages before being applied to CRT 10. The pixel stream to CRT 10 is tapped off and sent to gray-scale converter 14 for display on a flat panel LCD.

Unlike CRTs, flat-panel displays such as most LCD's are digital devices and can only display a pixel as fully on or fully off. CRTs are analog devices that can display shades of multi-bit pixels by increasing or decreasing the intensity of a displayed pixel or its color components. Gray-scale converter 14 converts multi-bit pixel intensities to digital (on or off) pixels. Two or more frames of LCD pixels are generated for each CRT frame. Frame-rate-cycling (FRC) is used to generate gray scales within these multiple frames by turning pixels on and off over the multiple frames in a FRC cycle that are generated from one CRT frame.

Each digital pixel is sent line modulation buffer 30 or to half-frame buffer 16. Half-frame buffer 16 stores half a frame of pixels so that the two panel-halves 20, 22 can be driven simultaneously to improve the contrast ratio. Line modulation buffer 30 is useful for buffering the mis-match in horizontal periods due to the line modulation. Line modulation buffer 30 is up to one horizontal line of pixels in size so that the line period can vary for modulation.

Data formatter 26 is used to buffer and re-format the pixels before being transferred to the line shift register inside the flat-panel display. While CRT's receive pixels one at a time, most flat-panel displays use a wider interface that accepts several pixels and parts of pixels for each clock pulse. Thus the pixel clock is usually divided down by 8/3, 16/3, 8 or 16 pixels to create a character clock or shift clock. The shift clock is used to clock in several pixels at one time from data formatter 26 to the flat panel assembly.

Data formatter 26 groups several pixels together so that they can be loaded in parallel into the flat-panel display. When dual-scan panels are used, two data streams must be simultaneously sent—one for upper panel-half 20 and another for lower panel-half 22. Data formatter 26 receives pixels for one half of the display from line modulation buffer 30 and for the other half of the display from half-frame buffer 16.

Once all pixels for upper panel-half 20 have been sent from gray-scale converter 14 and stored by half-frame buffer 16, then data formatter 26 swaps its inputs. Then half-frame buffer 16 supplies the buffered pixels to upper panel-half 20, while the incoming pixels from gray-scale converter 14 buffered by line modulation buffer 30 are sent to lower panel-half 22. These incoming pixels are also stored in half-frame buffer 16.

Line modulation buffer 30 is much smaller in size than half-frame buffer 16. About 300 lines are stored by half-frame buffer 16, while only one or a part of one line is stored by line modulation buffer 30. Pixels from gray-scale converter 14 are delayed by half of a frame period by half-frame buffer 16, but are delayed by less than a horizontal period by line modulation buffer 30.

For four-frame FRC cycles, a 2-bit row intensity is input to gray-scale converter 14 to indicate the intensity of the current row in the current frame. Gray-scale converter 14 could generate this information itself from the horizontal and vertical counters. Gray-scale converter 14 generates the four frames of pixels for each pixel as it is being input from the CRT pixel stream that is output from pixel pipeline 12. Gray-scale converter 14 needs to know the order of the row-select times for the four frames for the current row of the pixels being processed. When a fixed order is used, gray-scale converter 14 only needs to know which row within the modulation group is being processed. This information is provided as a 2-bit row intensity signal generated by 2-bit counter 18.

Counter 18 is a standard 2-bit binary or gray-code counter that indicates which of the four rows in a group are being processed by gray-scale converter 14. When a horizontal line is finished, the horizontal clock H_CLK to CRT 10 is pulsed. This increments counter 18 and increments the row intensity to the next value in the sequence. At the end of a frame, counter 18 is double-clocked, once by H_CLK and a second time by the vertical clock V_CLK, both of which are ORed together by OR gate 24 that drives the clock input of counter 18. Double-clocking advances the modulation sequence so that the next on-time is applied for rows in the next frame. This produces the modulation pattern shown in FIG. 7.

The shade of a pixel is matched in a look up table indexed by the frame count and row count. These counts specify what the line row time will be. If this row time contributes to the required sequence of on row-times for that shade, the row will be illuminated for that frame and pixel.

The horizontal and vertical clocks H_CLK and V_CLK applied to OR gate 24 that generate the row intensity count to gray-scale converter 14 are the clocks with respect to the input to gray-scale converter 14. The clocks to the flat-panel itself are likely delayed in phase relative to these clocks due to pipeline delays. Since the input to gray-scale converter is taken from the CRT pixel stream, these are essentially CRT timing signals rather than flat-panel timing signals.

The line pulse LP and the frame clock F_CLK (or next frame) signals applied to flat-panel display 21 are delayed from the CRT horizontal and vertical sync signals. Additionally, the line pulse is modulated so that it's cycle periods vary. Line-modulation buffer 30 and half-frame buffer 16 have input clocks controlled by CRT timing, but an output clock (shift or character clock CHAR_CLK) controlled by flat-panel timing.

Generation of Modulated Line Pulse—FIG. 9

FIG. 9 is a diagram of a generator for the modulated line pulse to the flat-panel display. D-type flip-flops 34, 36 form a gray code counter similar to the counter that generated the row intensity to the gray-scale converter in FIG. 8. Flip-flops 34, 36 are clocked by the output of OR gate 32. A binary counter could be substituted.

OR gate 32 receives the line pulse LP signal being generated, and the frame clock FR_CLK generated as a pulse by divider 48 after enough line pulses have been received for the entire frame, such as 760 (600 lines plus the vertical retrace period) for SVGA. Alternatively, FR_CLK is driven by the CRT Vsync or the next-frame signal for the pixel datapath pipeline.

Whenever the flat-panel display is advanced to a new horizontal line by a LP pulse, or to a new frame by a pulse on FR_CLK, OR gate 32 causes the counter of flip-flops 34, 36 to advance. At then end of a frame, the counter is essentially double-clocked by the frame clock as well as the line pulse LP. This advances the modulation sequence by an additional row for the next frame.

Register 52 contains four values for the total number of pixels in a horizontal line. Multiplexer or mux 50 selects a different one of the four values from register 52 as the number of pixels in the current line. Counter 44 keeps track of the number of pulses of the pixel clock to the flat panel, the shift clock CHAR_CLK, and outputs the current pixel number to comparator 40. Comparator 40 compares the current pixel count from counter 44 to the total pixel count selected by mux 50.

When the current pixel count in the current line reaches the total pixel count selected by mux 50, the end of the current line is reached and comparator 40 outputs the line pulse on signal line LP. Counter 44 is cleared by the LP pulse from comparator 40 to begin counting pixels for the next line. The LP pulse advances the counter of flip-flops 34, 36 so that mux 50 selects a different total pixel value from register 52 for the next line. At system initialization, counter 44 is reset before the first LCD pixel is clocked to the flat panel display so that the LP pulse is properly synchronized to the pixel stream and Vsync. Mux 50 selects a different value for the total number of pixels in a line from register 52 for each new line. Since the total number of pixels in a line is varied, the length of time between LP pulses is also varied. This variation in the LP period results in lines being selected or illuminated in the flat-panel matrix for different amounts of time.

Register 52 and mux 50 set the total number of pixels to 900 when the counter (flip-flops 34, 36) output 00, or to 970 when the counter outputs 01, 1100 for 10, and 1050 for 11. The line time is thus modulated over a range of +/−10% from the nominal 1000 total pixels. The amount of modulation can be changed by programming different values into register 52, and the modulation sequence can be changed by changing the sequence of the four vales in register 52. Using a programmable register 52 allows the optimal values to be determined empirically in the lab. Different values can be programmed in by the display driver when the resolution is changed.

To produce the on-times described earlier, that varied from 17 $\mu$S to 36 $\mu$S, values such as 680, 800, 1080, and 1440 need to be programmed into register 52 as the total number of pixels for the sequence of rows. This is a much larger amount of modulation, a range of −32 and +44% from the nominal 1000 pixels. Since there are 800 pixels to display on each line, there are not enough clock periods to even transfer these 800 pixels for the 680 total value.

These wider values can still be used if the pixels are transferred to the flat-panel display at a faster rate. The data formatter can send several pixels to the display for each shift clock pulse, and this clock can be speeded up without changing other clocks. When the line modulation buffer is filled up before the line begins, the pixels can quickly be transferred to the display in a burst.

Rather than specify the number of pixels, the number of characters can be programmed into register 52 when counter 44 outputs a character count rather than a pixel count.

ADVANTAGES OF THE INVENTION

The invention dramatically increases the number of gray shades for any given number of frames in a frame-rate cycle. In the simple example shown in FIGS. 3 and 6, the number of gray scales is increased from 5 to 16.

A graphics controller is described with improved gray-scaling. The number of gray shades produced is increased for a fixed number of frames. More than 5 gray shades are produced over a 4-frame FRC cycle. The inherently digital nature of the flat-panel display is used to advantage to increase available gray scales using FRC.

ALTERNATE EMBODIMENTS

Several other embodiments are contemplated by the inventors. Pipelining can change the exact times and relationships of various data streams and clock signals. For example, pipelining registers in the CRT path after the gray-scale converter input cause the CRT to be refreshed at a slightly later time relative to the LCD. Similar pipeline delays in the LCD path can delay the actual LCD refresh relative to that indicated in the tables. Indeed, delays in the flat-panel itself are common as well. Since the pixels are transferred first to the line-shift buffer inside the flat-panel assembly before being displayed with the next LP pulse, this pipeline delay must be taken into account when calculating gray scales. FIFO buffer can be added in several of the data paths. The half-frame buffer could be slightly larger than a half-frame if more buffering is needed.

OR gate 32 can be replaced with a state machine that sequences the row times assignment to rows differently across frames, based on pre-loaded or dynamically calculated dithered sequences. This state machine would have as inputs the line and frame sync signals and the pixel clock.

Different values can be chosen for the on-time of a row for each of the four frames in the FRC cycle. Ideally, none of the values chosen can be summed to get other values, since this can cause aliasing. For example, the values 16, 20, 27, 36 $\mu S$ are undesirable, since the values 16 and 20 sum to 36, another one of the values. A cycle with the pixel on for the first and second frames then has the same total on time (36 $\mu S$), as when the pixel is on for only the fourth frame. Different numbers of frames can also be chosen for the FRC cycle.

The shade produced from a cycle of frames can be called a frame-group shade. Mixing two adjacent frame-group shades in a flicker-reducing dithered temporal and spatial pattern over a cycle of frame cycles produces additional shades, which are useful in many applications.

The frame period could also be modulated over a cycle of frames. Different numbers of frames could be used for a FRC cycle, and different numbers of rows used in a modulation group, although powers of 2 are preferred. The shift clock to the flat-panel display may be run faster than normal to burst the pixels into the panel's line-shift register. This allows for greater modulation in the line times, since the amount of time needed to transfer all the pixels into the display is reduced.

Half-frame buffers can be employed with the invention. Each line is then driven twice during each frame, preferably for the same amount of time during the two half frames. Modulation of rows still occurs, but the rows are driven twice rather than just once for each frame. Other resolutions besides SVGA also can be used with the invention.

The invention can be implemented with more complex logic than the simple binary counters and buffers shown. Most modern controllers are synthesized from hardware-design-language (HDL) modules that define the operation of the logic at a high level. This allows for more complex sequences to be used. For example, a better sequence that reduces flicker is to interleave the modulation pattern so that there is not a big step in on-times at the end of a modulation sequence. The sequence 17, 20, 36, 20 $\mu S$ might be better than 17, 20, 27, 36 $\mu S$.

Of course, the CRT can be disabled as it often is for laptop PCs. Indeed, no connection to a CRT is necessary. The term CRT frame has been used as an input frame while the LCD frame as an output frame, but other display configurations are possible. While CRT frames are commonly used today as the input frame, it is possible that future systems will have the LCD frame or some other display frame as the input frame or output frame. The average line time of the CRT or input frame should be an integer multiple of the average line time of the LCD or output frame.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A flat-panel graphics controller with a modulated line clock to a flat-panel display, the flat-panel graphics controller comprising:

a pixel pipeline for generating a stream of pixels for display;

a gray-scale converter, coupled to receive the stream of pixels from the pixel pipeline, for converting the stream of pixels from a multi-bit-per-color cathode-ray tube (CRT) format to a single-bit-per-color flat-panel format, the gray-scale converter generating multiple frames of a pixel in the flat-panel format for each pixel received in the CRT format, the gray-scale converter outputting converted pixels in the flat-panel format; and a modulated line-pulse generator, coupled to the flat-panel display by a line-pulse signal, for generating a line pulse at an end of a horizontal line of pixels sent to the flat-panel display, the line-pulse signal having a modulated period that varies for different horizontal lines within a single frame of horizontal lines for display to a user at a same time, wherein a first horizontal line and a second horizontal line of pixels from the single frame sent to the flat-panel display have different horizontal periods of time between line pulses;

wherein the line pulse causes the flat-panel display to end illumination of a current horizontal line of pixels and shift in a next horizontal line of pixels into a display matrix for visibly illuminating pixels on the display;

wherein the horizontal period of time between line pulses is not constant but is modulated within the single frame.

2. The flat-panel graphics controller of claim 1 further comprising:

a buffer, coupled to the gray-scale converter, for storing the converted pixels for display by the flat-panel display; and a data formatter, coupled to the buffer, for arranging the converted pixels from the buffer for transfer to the flat-panel display.

3. The flat-panel graphics controller of claim 2 further comprising:

a row-intensity control for the gray-scale converter, for indicating when the stream of pixels are for display in a first horizontal line having a high intensity from a longer horizontal period or in a second horizontal line with a low intensity from a shorter horizontal period.

4. The flat-panel graphics controller of claim 3 wherein a pixel illuminated in the second horizontal line with the shorter horizontal period has a darker gray-scale shade than a pixel illuminated in the first horizontal line with the longer horizontal period;

wherein a number of gray-scale shades is increased by modulation of the horizontal period.

5. The flat-panel graphics controller of claim 3 wherein the line-pulse signal is also modulated across the multiple frames generated by the gray-scale converter, wherein a first horizontal line in a first frame has a different horizontal period than the first horizontal line in a second frame.

6. The flat-panel graphics controller of claim 5 wherein the first horizontal line has a different horizontal period when displayed in each of the multiple frames generated across multiple frames that comprise a frame sequence of row times that are on or off and that integrate to the shade value;

wherein any physical horizontal line of the display has a different horizontal period when displayed in each of the multiple frames generated, whereby the horizontal periods are modulated across multiple frames.

7. The flat-panel graphics controller of claim 6 wherein the gray-scale converter performs gray-scaling by frame-rate cycling (FRC), turning a pixel on and off over a cycle of multiple frames where a gray-scale shade generated is proportional to a total amount of time that a pixel is illuminated during the cycle of multiple frames.

8. The flat-panel graphics controller of claim 7 wherein a pixel is illuminated for a longer period of time for one frame than for another frame in the cycle of multiple frames, wherein the gray-scale converter darkens the gray-scale shade generated by illuminating the pixel for the frame with the shorter period of time of pixel illumination relative to the frame with the longer period of time, whereby the gray-scale converter changes the gray-scale shade by selecting which frames in which the pixel is illuminated, and not just by a number of frames having the pixel illuminated.

9. The flat-panel graphics controller of claim 8 wherein 16 different gray-scale shades are generated for pixels over a four-frame cycle of frames when a first horizontal line has four different values of the horizontal period for each of the four frames in the four-frame cycle, whereby a number of gray-scale shades is increased to 16 for a 4-frame FRC.

10. The flat-panel graphics controller of claim 8 wherein a total frame period for all horizontal lines in a display is constant, wherein the horizontal periods are modulated within a frame, but the sum of all horizontal periods within a frame is constant, wherein the horizontal line period but not the frame rate is modulated.

11. The flat-panel graphics controller of claim 3 further comprising:

an external cathode-ray tube (CRT) output for connecting the stream of pixels from the pixel pipeline to an external CRT monitor.

12. The flat-panel graphics controller of claim 11 further comprising:

a horizontal sync signal to the external CRT monitor;

a vertical sync signal to the external CRT monitor;

wherein a CRT horizontal period of the horizontal sync signal is constant, but the horizontal period of the line pulse signal to the flat-panel display is not constant but is modulated.

13. The flat-panel graphics controller of claim 3 wherein the buffer comprises:

a line buffer for storing a horizontal line of pixels for display by a first half-pane of the flat-panel display;

a half-frame buffer for storing a full half-pane of horizontal lines of pixels for display by a second half-pane of the flat-panel display;

wherein the data formatter swaps inputs to the first and second half-panes of the flat-panel display after each half-pane is written.

14. The flat-panel graphics controller of claim 3 further comprising:

a state machine for advancing assignment of illumination of pixels in a row to the plurality of frames based on a predetermined sequence.

15. A flat-panel graphics controller with a modulated line clock to a flat-panel display, the flat-panel graphics controller comprising:

a pixel pipeline for generating a stream of pixels for display;

a gray-scale converter, coupled to receive the stream of pixels from the pixel pipeline, for converting the stream of pixels from a multi-bit-per-color cathode-ray tube (CRT) format to a single-bit-per-color flat-panel format, the gray-scale converter generating multiple frames of a pixel in the flat-panel format for each pixel received in the CRT format, the gray-scale converter outputting converted pixels in the flat-panel format; and a modulated line-pulse generator, coupled to the flat-panel display by a line-pulse signal, for generating a line pulse at an end of a horizontal line of pixels sent to the flat-panel display, the line-pulse signal having a modulated period that varies for different horizontal lines, wherein a first horizontal line and a second horizontal line of pixels sent to the flat-panel display have different horizontal periods of time between line pulses;

wherein the line pulse causes the flat-panel display to end illumination of a current horizontal line of pixels and shift in a next horizontal line of pixels into a display matrix for visibly illuminating pixels on the display;

wherein the horizontal period of time between line pulses is not constant but is modulated;

wherein a character is one or more partial pixels, and wherein the modulated line-pulse generator comprises:

a pixel counter for counting a number of characters transferred to the flat-panel display in a current horizontal line, the pixel counter being incremented by a character and outputting a character count;

a register for storing total character counts for successive horizontal lines;

a multiplexer, coupled to the register, for selecting one of the total character counts as a current total character count; and a comparator, coupled to the pixel counter and to the multiplexer, for outputting the line pulse when the character count from the pixel counter reaches the total character count selected by the multiplexer;

wherein the total character counts stored in the register differ, with some total character counts being larger than other total character counts, wherein when the multiplexer selects the larger total character counts, the horizontal period of time between the line pulses is larger than when multiplexer selects the smaller total character counts, whereby the horizontal period of the line pulse signal is modulated.

16. The flat-panel graphics controller of claim 15 wherein the multiplexer selects a different total character count from the register after each line pulse is generated.

17. The flat-panel graphics controller of claim 16 further comprising:

a modulation counter, coupled to control the multiplexer, for selecting one of the total character counts from the register using the multiplexer, wherein the modulation counter is incremented by each line pulse.

18. The flat-panel graphics controller of claim 17 wherein the modulation counter is also incremented by a next-frame clock generated after an entire frame of horizontal lines has been transferred to being a next frame, whereby the modulation counter is advanced in sequence when a new frame begins so that horizontal line periods are modulated among successive frames.

19. A gray-scale method for generating $2^n$ gray-scale shades for approximating multi-bit colors on a computer display, the gray-scale method comprising:

generating a modulated line-pulse signal having n different line periods of time between line pulses, the line periods of time being generated in a sequence;

applying the modulated line-pulse signal to a flat-panel display;
  (a) shifting a new line of pixels into a display matrix for visible illumination to a user when the line pulse is received by the flat-panel display;
  (b) generating a new-frame signal to the flat-panel display once an entire first frame of lines has been transferred to the flat-panel display;
  (c) advancing the sequence when the new-frame signal is generated so that a different line period than for the first frame is applied to any physical line in the flat-panel display for a second frame;

repeating steps (a) through (c) until n frames have been transferred to the flat-panel display, wherein any pixel on any line can be displayed as one of $2^n$ possible shades of gray by turning the pixel on in a sequence to match any of the $2^n$ combinations of a pixel being on or off in the n frames, wherein the shade of gray is related to a total illumination time for a pixel, which is the sum of the different line periods for lines and frames in which the pixel is illuminated.

20. The gray-scale method of claim 19 wherein n is 4 frames of a four-frame frame-rate cycle, and wherein 16 gray shades are generated for pixels using the four frames and the modulated line period.

21. A graphics controller with an increased number of gray-sale shades comprising:

a gray-scale converter for performing frame-rate cycling (FRC) to generate shades of gray by turning pixels on and off over n multiple frames;

a modulated line-clock generator for generating a line clock having a non-constant horizontal period that varies among n different values of the horizontal period; and a modulation counter, coupled to be incremented after each line of pixels, for sending a modulation count to the gray-scale converter, the modulation count indicating the value of the horizontal period for a current line of pixels being converted from a multi-bit format to a binary format by the gray-scale converter;

wherein the gray-scale converter generates a gray scale for a pixel by determining not just how many frames to turn the pixel on, but also which of the n multiple frames to turn the pixel on, the gray-scale converter using the modulation count to determine a horizontal period for the pixel in each of the n multiple frames and choosing to turn the pixel on during frames that have longer or shorter horizontal periods to adjust the gray scale, whereby gray scales are determined by the different horizontal periods of a line in the n multiple frames of the FRC.

* * * * *